(12) United States Patent
Feng et al.

(10) Patent No.: US 8,207,431 B2
(45) Date of Patent: Jun. 26, 2012

(54) TRANSMISSION ELECTRON MICROSCOPE MICRO-GRID AND METHOD FOR MANUFACTURING THE SAME

(75) Inventors: Cheng Feng, Beijing (CN); Li Fan, Beijing (CN); Liang Liu, Beijing (CN); Li Qian, Beijing (CN); Yu-Quan Wang, Beijing (CN)

(73) Assignee: Beijing FUNATE Innovation Technology Co., Ltd., Beijing (CN)

( * ) Notice: Subject to any disclaimer, the term of this patent is extended or adjusted under 35 U.S.C. 154(b) by 31 days.

(21) Appl. No.: 12/848,321

(22) Filed: Aug. 2, 2010

(65) Prior Publication Data

US 2011/0192988 A1 Aug. 11, 2011

(30) Foreign Application Priority Data

Feb. 8, 2010 (CN) .......................... 2010 1 0106698

(51) Int. Cl.
*B32B 37/16* (2006.01)
*B32B 5/12* (2006.01)
*B32B 5/22* (2006.01)
*H01J 37/26* (2006.01)

(52) U.S. Cl. ... 977/742; 977/842; 250/311; 250/440.11; 156/250; 156/246; 156/77; 438/409; 438/960

(58) Field of Classification Search ................... 250/311, 250/440.11; 977/742, 842; 156/250, 246, 156/77; 438/409, 960
See application file for complete search history.

(56) References Cited

U.S. PATENT DOCUMENTS

| | | | |
|---|---|---|---|
| 7,045,108 B2 | 5/2006 | Jiang et al. | |
| 7,745,302 B2 * | 6/2010 | Zhang et al. | 438/409 |
| 8,038,908 B2 * | 10/2011 | Hirai et al. | 252/502 |
| 8,048,256 B2 * | 11/2011 | Feng et al. | 156/305 |
| 8,057,778 B2 * | 11/2011 | Feng et al. | 423/447.3 |
| 2007/0166223 A1 | 7/2007 | Jiang et al. | |
| 2008/0237464 A1 * | 10/2008 | Zhang et al. | 250/311 |
| 2008/0248235 A1 | 10/2008 | Feng et al. | |
| 2008/0299031 A1 | 12/2008 | Liu et al. | |
| 2009/0317926 A1 | 12/2009 | Zhang et al. | |
| 2011/0192533 A1 * | 8/2011 | Qian et al. | 156/250 |
| 2011/0192987 A1 * | 8/2011 | Qian et al. | 250/440.11 |
| 2011/0253669 A1 * | 10/2011 | Liu et al. | 216/36 |

FOREIGN PATENT DOCUMENTS

| | | |
|---|---|---|
| CN | 101276724 A | 10/2008 |
| CN | 101609771 | 12/2009 |
| JP | P2006-244742 A | 9/2006 |
| WO | WO2007015710 | 2/2007 |

\* cited by examiner

*Primary Examiner* — Nikita Wells
(74) *Attorney, Agent, or Firm* — Altis Law Group, Inc.

(57) ABSTRACT

A transmission electron microscope (TEM) micro-grid includes a pure carbon grid having a plurality of holes defined therein and at least one carbon nanotube film covering the holes. A method for manufacturing a TEM micro-grid includes following steps. A pure carbon grid precursor and at least one carbon nanotube film are first provided. The at least one carbon nanotube film is disposed on a surface of the pure carbon grid precursor. The pure carbon grid precursor and the at least one carbon nanotube film are then cut to form the TEM micro-grid in desired shape.

18 Claims, 7 Drawing Sheets

TRANSMISSION ELECTRON MICROSCOPE MICRO-GRID AND METHOD FOR MANUFACTURING THE SAME

CROSS-REFERENCE TO RELATED APPLICATIONS

This application claims all benefits accruing under 35 U.S.C. §119 from China Patent Application No. 201010106698.7, filed on 2010 Feb. 8, in the China Intellectual Property Office, the disclosure of which is incorporated herein by reference. This application is related to commonly-assigned applications entitled, "METHOD FOR MANUFACTURING TRANSMISSION ELECTRON MICROSCOPE MICRO-GRID", filed Aug. 2, 2010, Ser. No. 12/848, 328 and "TRANSMISSION ELECTRON MICROSCOPE MICRO-GRID", filed Aug. 2, 2010, Ser. No. 12/848,315. Disclosures of the above-identified applications are incorporated herein by reference.

BACKGROUND

1. Technical Field

The present disclosure relates to transmission electron microscope micro-grids and methods for manufacturing the same, and particularly to a transmission electron microscope micro-grid based on carbon nanotubes.

2. Description of Related Art

In a transmission electron microscope, a porous carbon supporting film (i.e., micro-grid) is used, as an important tool, to carry powder samples and to observe high resolution transmission electron microscope images. With the development of nanotechnology, micro-grids are increasingly coming into widespread use in the field of electron microscopy. The micro-grids used in transmission electron microscopes are usually manufactured using a layer of organic porous membrane covered on a metal mesh net, such as copper mesh net, or nickel mesh net, and subsequently a layer of non-crystal carbon films are deposited thereon via evaporation.

However, the metal mesh nets usually contain impurities such as metal oxide, which can cause interference in the component analysis of observed samples.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
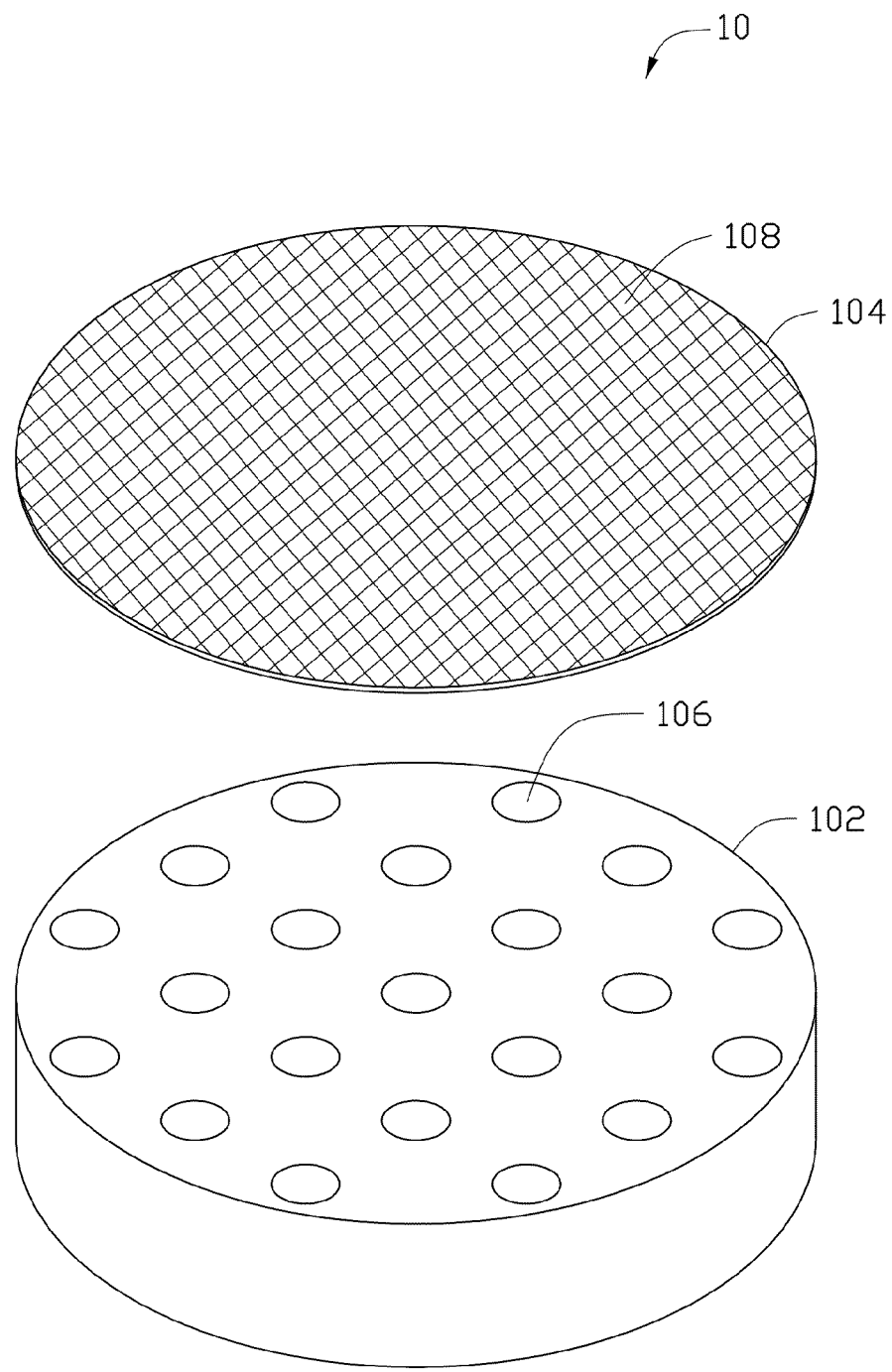
FIG. 1 is an exploded, isometric view of one embodiment of a transmission electron microscope (TEM) micro-grid.
Figure 2:
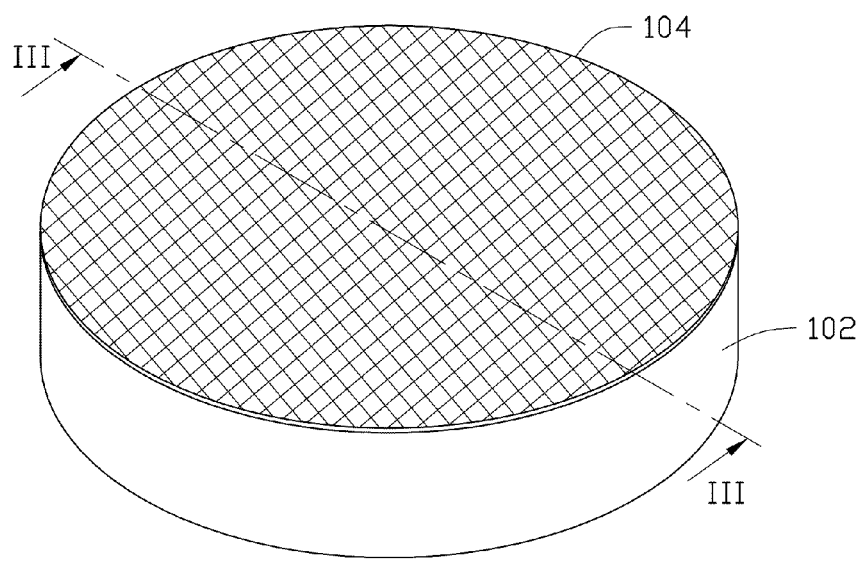
FIG. 2 is an assembled view of FIG. 1.
Figure 3:
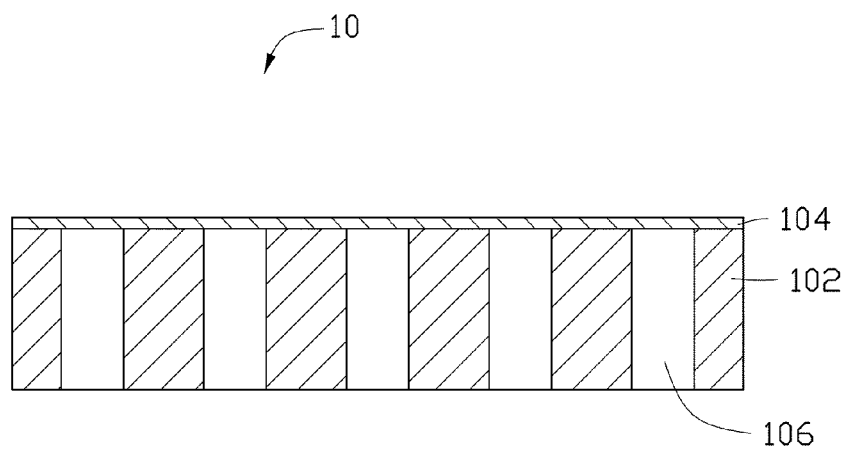
FIG. 3 is a transverse cross-section of the TEM micro-grid of FIG. 2.

Referring to FIGS. 1-3, one embodiment of a TEM micro-grid 10 comprises a pure carbon grid 102 and at least one carbon nanotube film 104. The film 104 is disposed on a surface of the grid 102. The grid 102 and the at least one film 104 are of high-purity.

The grid 102 is a freestanding structure. The term "freestanding" includes, but is not limited to, a structure that does not have to be supported by a substrate and can sustain its weight when hoisted by a portion thereof without any significant damage to its structural integrity. The grid 102 defines a plurality of holes 106 therein. The shape of the holes 106 is not limited, and the holes 106 can be fabricated having any of many shapes, such as round, elliptical, and square, to adapt to actual needs. The size or diameter of the holes 106 is not limited, and can be adjusted according to actual needs.

The distribution of the holes 106 in the grid 102 is not limited. The distances between adjacent holes 106 can be equal and different. The holes 106 can be uniformly distributed in the grid 102. The holes 106 can also be arranged in an array.

In one embodiment, the grid 102 can be a round sheet having a diameter of about 3 millimeters. The thickness of the grid 102 can range from about 3 μm to about 20 μm. The holes 106 can be round and extend through opposite surfaces of the grid 102. The diameters of the holes 106 can range from about 10 μm to about 200 μm. The holes 106 can be uniformly distributed in the grid 106. The distances between adjacent holes 106 can be equal to or larger than 1 μm.

The grid 102 can be made of carbon black or carbon nanotubes. If the grid 102 is made of carbon black, the grid 102 can be a round film of carbon black, and the diameters of the holes 106 can range from about 30 μm to about 200 μm. If the grid 102 is made of carbon nanotubes, the grid 102 can be a round sheet of carbon nanotube structure.

The carbon nanotube structure comprises at least one carbon nanotube film. The number of carbon nanotube films depends on the thickness of each individual layer of carbon nanotube film, so long as the carbon nanotube structure can provide a proper support according to the actual needs. The thinner each individual layer of carbon nanotube film, the larger the number of the layers of carbon nanotube films. The thicker each individual layer of carbon nanotube film, the smaller the number of the layers of carbon nanotube films. Adjacent layers of carbon nanotube films can be combined by Van der Waals attractive force. The carbon nanotube film can be a flocculated carbon nanotube film, a pressed carbon nanotube film or a drawn carbon nanotube film.

Flocculated Carbon Nanotube Film

Figure 4:
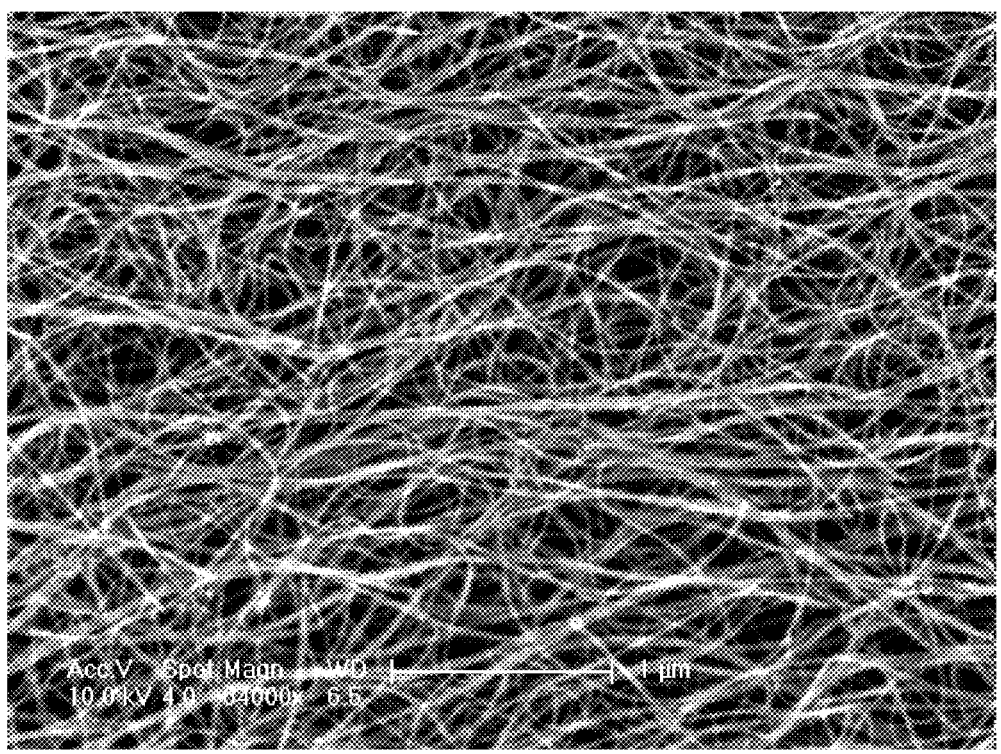
FIG. 4 shows a Scanning Electron Microscope (SEM) image of a flocculated carbon nanotube film.

In some embodiments, the carbon nanotube structure can include a flocculated carbon nanotube film. Referring to FIG. 4, the flocculated carbon nanotube film can include a plurality of long, curved, disordered carbon nanotubes entangled with each other. Further, the flocculated carbon nanotube film can be isotropic. The carbon nanotubes can be substantially uniformly dispersed in the carbon nanotube film. Adjacent carbon nanotubes are acted upon by van der Waals attractive force to obtain an entangled structure with micropores defined therein.

It is understood that the flocculated carbon nanotube film is very porous. The sizes of the micropores can be less than 10 μm. The porous nature of the flocculated carbon nanotube film will increase the specific surface area of the carbon nanotube structure. Because the carbon nanotubes in the carbon nanotube structure are entangled with each other, the carbon nanotube structure employing the flocculated carbon nanotube film has excellent durability, and can be fashioned into desired shapes with a low risk to the integrity of the carbon nanotube structure. The thickness of the flocculated carbon nanotube film can range from about 1 μm to about 2 mm. It is understood that the carbon nanotube structure can include a single layer of flocculated carbon nanotube film, and the single layer of flocculated carbon nanotube film can provide suitable support performance by adjusting the thickness thereof.

Pressed Carbon Nanotube Film

Figure 5:
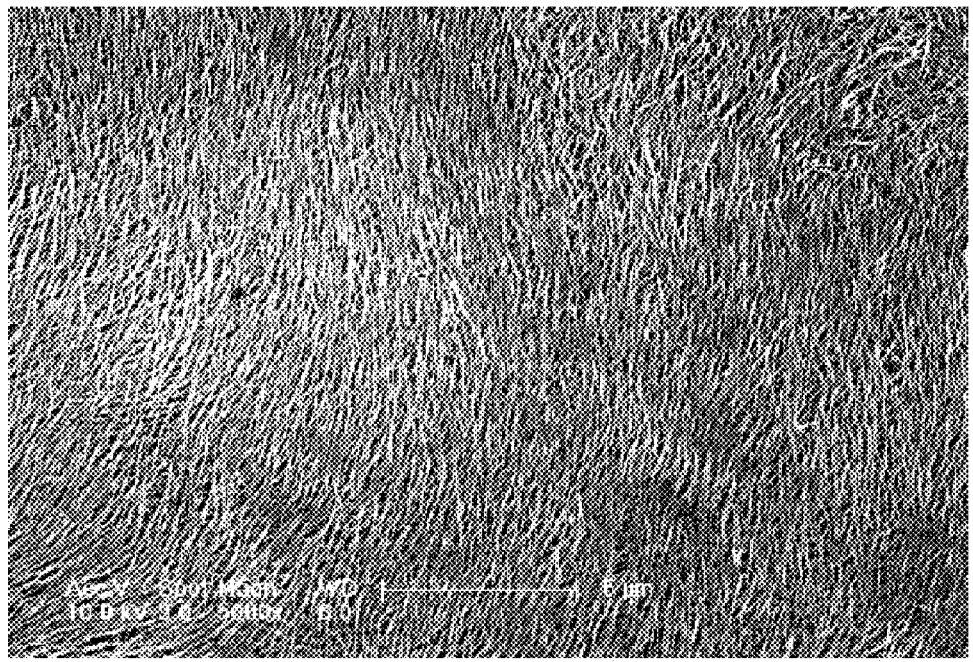
FIG. 5 is an SEM image of a pressed carbon nanotube film.

In other embodiments, the carbon nanotube structure can include at least a pressed carbon nanotube film. Referring to FIG. 5, the pressed carbon nanotube film can be a freestanding carbon nanotube film. The carbon nanotubes in the pressed carbon nanotube film can be arranged along a same direction or along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to about 15 degrees. The greater the pressure applied, the smaller the angle obtained.

If the carbon nanotubes in the pressed carbon nanotube film are arranged along different directions, the carbon nanotube structure can be isotropic. Here, "isotropic" means the carbon nanotube film has properties identical in all directions substantially parallel to a surface of the carbon nanotube film. The thickness of the pressed carbon nanotube film can range from about 0.5 nm to about 1 mm. Examples of a pressed carbon nanotube film are taught by US PGPub. 20080299031A1 to Liu et al.

It is understood that the carbon nanotube structure can include a single layer of pressed carbon nanotube film, and the single layer of pressed carbon nanotube film can provide suitable support performance by adjusting the thickness thereof.

Drawn Carbon Nanotube Film

In other embodiments, the carbon nanotube structure can include at least one drawn carbon nanotube film. Examples of a drawn carbon nanotube film are taught by U.S. Pat. No. 7,045,108 to Jiang et al., and WO 2007015710 to Zhang et al. The drawn carbon nanotube film includes a plurality of successive and oriented carbon nanotubes joined end-to-end by van der Waals attractive force therebetween. The carbon nanotubes in the carbon nanotube film can be substantially aligned in a single direction. The drawn carbon nanotube film can be formed by drawing a film from a carbon nanotube array capable of having a film drawn therefrom.

Figure 6:
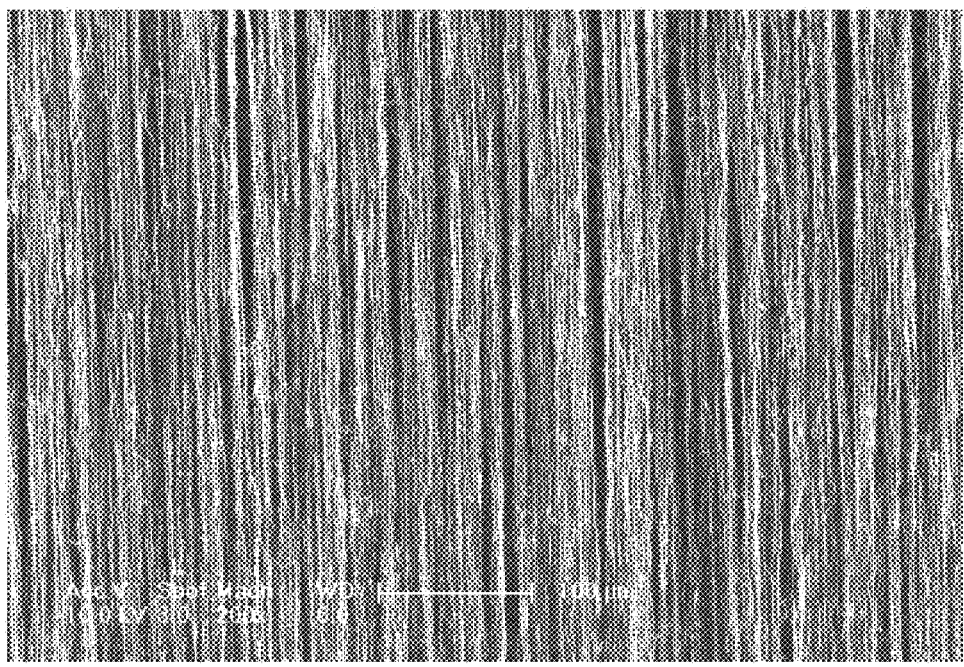
FIG. 6 is an SEM image of a drawn carbon nanotube film.
Figure 7:
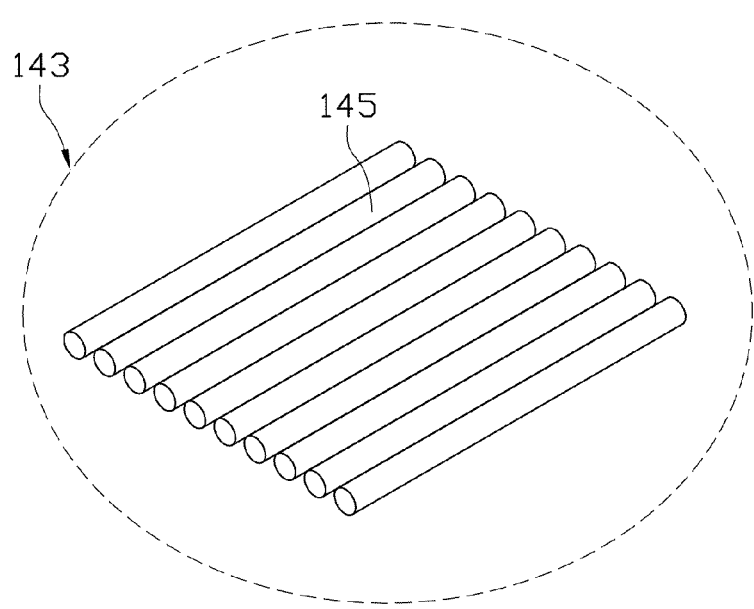
FIG. 7 is a schematic, enlarged view of a carbon nanotube segment in the drawn carbon nanotube film of FIG. 6.

Referring to 6 and FIG. 7, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 substantially parallel to each other, and combined by van der Waals attractive force therebetween. As can be seen in FIG. 6, some variations can occur in the drawn carbon nanotube film. The carbon nanotubes 145 in the drawn carbon nanotube film are also oriented along a preferred orientation. In one embodiment, the thickness of the drawn carbon nanotube film can range from about 0.5 nm to about 100 μm, and the carbon nanotube structure can have at least ten layers of drawn carbon nanotube films.

The carbon nanotube structure can also include at least two stacked drawn carbon nanotube films. An angle can exist between the carbon nanotubes in adjacent stacked drawn carbon nanotube films. Adjacent drawn carbon nanotube films can be combined by only the Van der Waals attractive force therebetween without the need of an additional adhesive. An angle between the aligned directions of the carbon nanotubes in the two adjacent drawn carbon nanotube films can range from about 0 degrees to about 90 degrees.

If the angle between the aligned directions of the carbon nanotubes in adjacent drawn carbon nanotube films is larger than 0 degrees, a microporous structure is defined by the carbon nanotubes. The carbon nanotube structure in one embodiment employing these films will have a plurality of micropores. The sizes of the micropores can be less than 10 μm.

In the embodiment shown in FIGS. 1-3, the carbon nanotube structure can have at least 100 layers of drawn carbon nanotube films, an angle between the aligned directions of the carbon nanotubes in the two adjacent drawn carbon nanotube films is about 90 degrees, the holes 106 are round, and each has a diameter ranging from about 30 μm to about 150 μm.

The at least one carbon nanotube film 104 is disposed on the surface of the grid 102 and covers the holes 106. Portions of the at least one carbon nanotube film 104 corresponding to the holes 106 are suspended over the holes 106, and are named herein 'suspended portions'. Each of the suspended portions functions as an electron transmission portion used to carry samples.

The at least one carbon nanotube film 104 can be a drawn carbon nanotube film described above. If there are two or more carbon nanotube films 104 covering the holes 106, an angle between the aligned directions of the carbon nanotubes in the two adjacent carbon nanotube films 104 can be about 90 degrees, and a microporous structure is defined by the carbon nanotubes of the carbon nanotube films 104. The carbon nanotube structure in one embodiment employing these films will have a plurality of micropores 108. The micropores 108 can be uniformly and regularly distributed in the carbon nanotube films 104. The sizes of the micropores 108 depend on the number of layers of the carbon nanotube films 104. The larger the number, the smaller the diameters. The sizes of the micropores 108 can range from about 1 nm to about 1 μm.

As described above, the grid 102 and the at least one carbon nanotube film 104 are made of carbon and do not need mesh nets, thus, the interference caused by metal mesh nets of the typical TEMS in the component analysis of samples can be eliminated or greatly reduced. Therefore, the accuracy and detail of a TEM adopting the TEM micro-grid 10 can be improved.

In application of the TEM micro-grid 10, the sample needed to be observed, can be disposed on the TEM micro-grid 10. If the sample is larger than the micropores 108, the sample can be placed on a surface of the at least one carbon nanotube film 104 and span across at least one of the holes 106. If the sample is smaller than the diameter or size of the micropores 108, particularly if the sample is smaller than about 5 nm, the sample can be adsorbed to the walls of the carbon nanotubes of the at least one carbon nanotube film 104.

A method for fabricating the TEM micro-grid 10 includes the steps of:
   (a) providing a pure carbon grid precursor and at least one carbon nanotube film;
   (b) disposing the at least one carbon nanotube film on a surface of the pure carbon grid precursor; and
   (c) cutting the pure carbon grid precursor and the at least one carbon nanotube film to form the TEM micro-grid 10 in a desired shape.

In step (a), the pure carbon grid precursor can be made of carbon black or carbon nanotubes.

If the pure carbon grid precursor is made of carbon black, the pure carbon grid precursor can be fabricated according to the following steps:

(1) providing a carbon slurry and a supporting body;
(2) disposing the carbon slurry on the supporting body;
(3) drying the carbon slurry disposed on the supporting body to form a pure carbon film; and
(4) forming a plurality of holes in the pure carbon film and separating the pure carbon film with holes from the supporting body.

In step (1), the carbon slurry can comprise a liquid mixture and carbon black. The weight percentage of the liquid mixture in the carbon slurry can range from about 15% to about 95%. Accordingly, the weight percentage of the carbon black in the carbon slurry can range from about 5% to about 85%.

The liquid mixture can comprise a solvent and a viscosity-controlling agent. The weight percentage of the solvent in the liquid mixture can range from about 20% to about 99.5%. The weight percentage of the viscosity-controlling agent in the liquid mixture can range from about 0.5 to about 40%. Optionally, the liquid mixture can further comprise a surface active agent and/or a binding agent. The weight percentage of the surface active agent in the liquid mixture can range from about 0.5% to about 20%. The weight percentage of the binding agent in the liquid mixture can range from about 0.5% to about 20%. The surface active agent can be polyoxyl ether analogous surfactants, such as polyoxyethylene octyl phenyl ether (TritonX100), and polyoxyethylene octylphenol ether (TritonX405). The binding agent can be tin dioxide powder or tin oxide colloid.

The solvent can be water, alcohols, or terpenoids. The alcohols can be methanol, ethanol, propanol, butanol, pentanol, heptanol, glycol, propanediol, propanetriol, phenylcarbinol, or allyl alcohol. The terpenoids can be isoborneol, borneol, camphor, borneol, camphene, menthone, menthol, or terpilenol. The viscosity-controlling agent can be starch or its salt, cellulose or its salt, or polyether. The cellulose or its salt can be tylose, ethyl cellulose, cellulose acetate, or sodium carboxymethyl cellulose. The polyether can be polyethyleneglycol, polypropylene glycol, polyglycerol, or copolymer of glycol and propylene glycol.

The carbon slurry can be manufactured by the following process. First, the viscosity-controlling agent is dissolved into the solvent to achieve a uniform liquid mixture. Next, the carbon black is disposed into the uniform liquid mixture. Finally, the liquid mixture and the carbon black are mechanically agitated for about 3 to 6 hours. In this embodiment, about 0.2 grams of ethyl cellulose are first dissolved in about 15 ml of ethyl cellulose to form a uniform liquid mixture via mechanical agitation. About 6 grams of carbon black powder are then disposed in the liquid mixture. Finally, the liquid mixture and carbon black powder are mechanically agitated for about 4 hours to achieve the carbon slurry.

The supporting body can be used to support the carbon slurry. Materials of the supporting body are not limited. The supporting body can be, for example, a glass board or a ceramic plate.

In step (2), the carbon slurry can be disposed on the supporting body via screen printing, scrape coating, or spin coating. In this embodiment, the carbon slurry is disposed on the supporting body by screen printing.

In step (3), the carbon slurry disposed on the supporting body can be dried by air at room temperature or by heating, thereby producing the pure carbon film.

In step (4), a laser beam can be used to form the holes 106 in the pure carbon film. The laser beam can be generated by, for example, an argon ion laser or carbon dioxide laser. The laser beam has a power of approximately 5-30 watts. The power is about 18 watts in one embodiment. The laser beam can be focused by a lens and irradiate on selected portions of the pure carbon film point by point, line by line. Carbon nanotubes in the irradiated portions absorb the laser beam energy, react with the oxygen in the air, and then decompose. Thus, carbon nanotubes in the irradiated portions will be removed and the holes 106 are formed. As a result, the pure carbon grid precursor made of carbon black is formed.

If the pure carbon grid precursor is made of carbon nanotubes, the grid 102 can be fabricated according to the following steps (I) providing a sheet of carbon nanotube structure formed from a plurality of carbon nanotubes; and
(II) forming a plurality of holes 106 in the sheet of carbon nanotube structure.

In step (I), the sheet of carbon nanotube structure includes at least one carbon nanotube film. The at least one carbon nanotube film can be a drawn carbon nanotube film, a pressed carbon nanotube film or a flocculated carbon nanotube film. In this embodiment, the sheet of carbon nanotube structure includes a plurality of stacked drawn carbon nanotube films. The drawn carbon nanotube films are crossed with each other. The drawn carbon nanotube films can be fabricated according to the following steps of: (I-1) providing an array of carbon nanotubes; and (I-2) drawing a carbon nanotube film from the array of carbon nanotubes.

In step (I-1), the array of carbon nanotubes can be a super-aligned array of carbon nanotubes. The super-aligned array of carbon nanotubes can be formed by the steps of:

(I-11) providing a substantially flat and smooth substrate;
(I-12) forming a catalyst layer on the substrate;
(I-13) annealing the substrate with the catalyst layer thereon in air at a temperature in a range from about 700° C. to about 900° C. for about 30 to about 90 minutes;
(I-14) heating the substrate with the catalyst layer thereon at a temperature in a range from about 500° C. to about 740° C. in a furnace with a protective gas therein; and
(I-15) supplying a carbon source gas to the furnace for about 5 to about 30 minutes and growing a super-aligned array of carbon nanotubes on the substrate.

In step (I-11), the substrate can be a P-type silicon wafer, an N-type silicon wafer, or a silicon wafer with a film of silicon dioxide thereon. In one embodiment, a 4 inch P-type silicon wafer can be used as the substrate. In step (I-12), the catalyst can be made of iron, cobalt, nickel, or any alloy thereof. In step (I-14), the protective gas can be made up of at least one of nitrogen ($N_2$), ammonia ($NH_3$), and a noble gas. In step (I-15), the carbon source gas can be hydrocarbon gas, such as ethylene ($C_2H_4$), methane (CH4), acetylene ($C_2H_2$), ethane ($C_2H_6$), or any combination thereof.

The super-aligned array of carbon nanotubes formed under the above conditions is essentially free of impurities, such as carbonaceous or residual catalyst particles. The carbon nanotubes in the super-aligned array of carbon nanotubes are closely packed together by the van der Waals attractive force. The super-aligned array of carbon nanotubes can have a height of about 200 to about 400 microns and can include a plurality of carbon nanotubes substantially parallel to each other and approximately perpendicular to the substrate.

Step (I-2) includes the sub steps of: (I-21) selecting a plurality of carbon nanotube segments having a predetermined width from the super-aligned array of carbon nanotubes; and (I-22), pulling the carbon nanotube segments at an even/uniform speed to form the carbon nanotube film.

In step (I-21), the carbon nanotube segments having a predetermined width, can be selected by using an adhesive tape as a tool to contact the super-aligned array. In step (I-22), the pulling direction is substantially perpendicular to the growing direction of the super-aligned array of carbon nanotubes.

During the pulling process, as the initial carbon nanotube segments are drawn out, other carbon nanotube segments are also drawn out end to end, due to the van der Waals attractive force between the ends of adjacent segments. The carbon nanotube film produced in such manner can be selectively formed having a predetermined width. The carbon nanotube film includes a plurality of carbon nanotube segments. The carbon nanotubes in the carbon nanotube film are mainly parallel to the pulling direction of the carbon nanotube film.

The stacked drawn carbon nanotube films can be formed by the steps of: (1) providing a substantially flat base, for example, a ceramic plate; and (2) stacking the drawn carbon nanotube films on the base. An angle between the aligned directions of the carbon nanotubes in the two adjacent drawn carbon nanotube films can range from about 0 degrees to about 90 degrees. Because the carbon nanotubes in the super-aligned array of carbon nanotubes have a high purity and a high specific surface area, the carbon nanotube film is adhesive. As such, the carbon nanotube films can be adhered to the surface of the base directly and a plurality of drawn carbon nanotube films can be adhered to a surface one after another to form a multi-layer carbon nanotube structure. The number of the layers of drawn carbon nanotube films is arbitrary and depends on the actual needs/use. The adjacent layers of the drawn carbon nanotube films are combined by Van der Waals attractive force to form a stable multi-layer film. Thus, the carbon nanotube structure is formed.

In step (II), a laser beam can be used to form the holes 106 in the carbon nanotube structure. The laser beam can be a pulsed laser beam. The laser beam can be generated by an argon ion laser or carbon dioxide laser. The laser beam has a power of approximately 5-30 watts. The power is about 18 watts in one embodiment. The laser beam can be focused by a lens and irradiate on selected portions of the pure carbon film point by point, line by line. Carbon nanotubes in the irradiated portions absorb the laser beam energy, react with the oxygen in the air, and then decompose. Thus, carbon nanotubes in the irradiated portions will be removed and the holes 106 are formed. As a result, the pure carbon grid precursor made of carbon nanotubes is formed.

In one embodiment, the sheet of carbon nanotube structure can be fixed, and the laser beam can be moved to irradiate selected portions of the sheet of carbon nanotube structure. In another embodiment, the laser beam can be fixed, and the sheet of carbon nanotube structure can be moved relative to the laser beam so that selected portions of the sheet of carbon nanotube structure can be irradiated by the laser beam. It is noteworthy that there may be some residual carbon nanotubes left in the laser irradiated portions, and the residual carbon nanotubes can also be used to carry samples.

In step (a), the at least one carbon nanotube film can be a drawn carbon nanotube film, which can be manufactured in a method described above.

When the pure carbon grid precursor and the at least one carbon nanotube film are ready, step (b) can be carried out. As described above, because the carbon nanotubes in the super-aligned array of carbon nanotubes have a high purity and a high specific surface area, the at least one carbon nanotube film is adhesive. As such, the at least one carbon nanotube film can be adhered to the pure carbon grid precursor. If the at least one carbon nanotube film comprises a plurality of stacked drawn carbon nanotube films, the stacked drawn carbon nanotube films can be adhered to a surface one after another. The adjacent layers of the drawn carbon nanotube films are combined by Van der Waals attractive force. An angle between the aligned directions of the carbon nanotubes in the two adjacent drawn carbon nanotube films are about 90 degrees. The stacked drawn carbon nanotube films have a plurality of micropores 108, and the sizes of the micropores 108 can range from about 1 nm to about 1 μm.

Further, the pure carbon grid precursor and the at least one carbon nanotube film can be treated with an organic solvent. The organic solvent is volatile and can be ethanol, methanol, acetone, dichloroethane, chloroform, and any combination thereof. The pure carbon grid precursor and the at least one carbon nanotube film can be treated by applying the organic solvent to the pure carbon grid precursor and the at least one carbon nanotube film, such as dropping the organic solvent from a dropper to soak surfaces of the pure carbon grid precursor and the at least one carbon nanotube film or immersing the pure carbon grid precursor and the at least one carbon nanotube film into a container having an organic solvent therein.

After being soaked by the organic solvent, two or more neighboring carbon nanotubes of each of the pure carbon grid precursor and the at least one carbon nanotube film will come closer together. Accordingly, the mechanical properties of each of the pure carbon grid precursor and the at least one carbon nanotube film can be improved. Further, the binding force between the pure carbon grid precursor and the at least one carbon nanotube film can also be improved after being soaked by the organic solvent.

When the at least one carbon nanotube film is disposed on the pure carbon grid precursor, step (c) is carried out. In step (c), the pure carbon grid precursor with the at least one carbon nanotube film disposed thereon can be cut into desired pieces and shapes via a laser beam. The TEM micro-grid 10 can then be formed in a desired shape. In this step, the laser beam can be generated by an argon ion laser or carbon dioxide laser. The laser beam has a power of approximately 5-30 watts. The power is about 18 watts in one embodiment. The laser beam can be controlled to irradiate an outer edge of a TEM micro-grid 10 until the TEM micro-grid 10 is cut off.

According to the above descriptions, the TEM grid 10 of the present disclosure has the following advantages.

(1) Because the pure carbon grid 102 and the at least one carbon nanotube film 104 are made of carbon and do not adopt mesh nets, interference caused by metal mesh nets of the typical TEMS in the component analysis of samples can be eliminated or greatly reduced. Therefore, the accuracy and detail of a TEM adopting the TEM micro-grid 10 can be improved.

(2) Compared to the conventional method for making TEM micro-grid, the TEM micro-grid in the present disclosure can be formed by a carbon nanotube film drawn from an array of carbon nanotubes covered, directly, on a pure carbon grid. The method is simple, fast, and conductive to large-scale production.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

It is also to be understood that above description and the claims drawn to a method may include some indication in reference to certain steps. However, the indication used is only to be viewed for identification purposes and not as a suggestion as to an order for the steps.

What is claimed is:

1. A transmission electron microscope (TEM) micro-grid comprising:
   a pure carbon grid having a plurality of holes defined therein;
   at least one carbon nanotube film covering the holes; and
   wherein the pure carbon grid is a sheet of carbon nanotube structure.

2. The TEM micro-grid of claim 1, wherein the pure carbon grid is a freestanding structure having a thickness ranging from about 3 μm to about 20 μm.

3. The TEM micro-grid of claim 1, wherein the at least one carbon nanotube film comprises a plurality of stacked drawn carbon nanotube films each comprising a plurality of carbon nanotubes aligned substantially along a same direction, and an angle between aligned directions of the carbon nanotubes in two adjacent drawn carbon nanotube films is larger than 0 degrees.

4. The TEM micro-grid of claim 3, wherein the stacked drawn carbon nanotube films of the at least one carbon nanotube film comprise a plurality of micropores.

5. The TEM micro-grid of claim 4, wherein sizes of the micropores are less than 10 μm.

6. The TEM micro-grid of claim 1, wherein the sheet of carbon nanotube structure is at least one carbon nanotube film, the at least one carbon nanotube film of the pure carbon grid being a flocculated carbon nanotube film, a pressed carbon nanotube film, or a drawn carbon nanotube film.

7. The TEM micro-grid of claim 6, wherein the pure carbon grid comprises a plurality of stacked drawn carbon nanotube films each comprising a plurality of carbon nanotubes aligned substantially along a same direction.

8. The TEM micro-grid of claim 7, wherein an angle between aligned directions of carbon nanotubes in two adjacent drawn carbon nanotube films of the pure carbon grid is larger than 0 degrees.

9. The TEM micro-grid of claim 8, wherein the pure carbon grid further comprises a plurality of residual carbon nanotubes located in the holes.

10. The TEM micro-grid of claim 1, wherein the holes extend through opposite surfaces of the pure carbon grid.

11. The TEM micro-grid of claim 1, wherein diameters of the holes range from about 10 μm to about 200 μm.

12. A method for manufacturing a transmission electron microscope (TEM) micro-grid comprising:
    providing a pure carbon grid precursor and at least one carbon nanotube film;
    disposing the at least one carbon nanotube film on a surface of the pure carbon grid precursor; and
    cutting the pure carbon grid precursor and the at least one carbon nanotube film to form the TEM micro-grid in desired shape.

13. The method of claim 12, wherein the pure carbon grid precursor is fabricated according to the following steps:
    providing a carbon slurry and a supporting body;
    disposing the carbon slurry on the supporting body;
    drying the carbon slurry disposed on the supporting body to form a pure carbon film; and
    forming a plurality of holes in the pure carbon film and separating the pure carbon film with holes from the supporting body.

14. The method of claim 13, wherein the carbon slurry is a mixture of a solvent, a viscosity-controlling agent, and carbon black.

15. The method of claim 13, wherein the step of forming the plurality of holes, comprises providing a laser beam and irradiating selected portions of the pure carbon film point by point and line by line.

16. The method of claim 12, wherein the pure carbon grid precursor is fabricated according to the following steps: providing a sheet of carbon nanotube structure formed of a plurality of carbon nanotubes; and forming a plurality of holes in the sheet of carbon nanotube structure.

17. The method of claim 16, wherein the step of forming the plurality of holes, comprises providing a laser beam and irradiating selected portions of the pure carbon film point by point and line by line.

18. The method of claim 17, wherein the step of forming the plurality of holes, comprises partly removing carbon nanotubes in the selected portions of the pure carbon film until some of the residual carbon nanotubes remain in the holes.

* * * * *

UNITED STATES PATENT AND TRADEMARK OFFICE
CERTIFICATE OF CORRECTION

PATENT NO. : 8,207,431 B2  
APPLICATION NO. : 12/848321  
DATED : June 26, 2012  
INVENTOR(S) : Feng et al.

Page 1 of 1

It is certified that error appears in the above-identified patent and that said Letters Patent is hereby corrected as shown below:

On the title page, Item [75] should read:

[75] Inventors: Chen Feng, Beijing (CN); Li Fan, Beijing (CN); Liang Liu, Beijing (CN); Li Qian, Beijing (CN); Yu-Quan Wang, Beijing (CN)

Signed and Sealed this  
Twenty-ninth Day of October, 2013

Teresa Stanek Rea  
*Deputy Director of the United States Patent and Trademark Office*